United States Patent [19]

Amador

[11] Patent Number: 4,978,050

[45] Date of Patent: Dec. 18, 1990

[54] DAMPED OPTICS TUBE ASSEMBLY

[75] Inventor: Gonzalo Amador, Dallas, Tex.

[73] Assignee: Texas Instruments Incorporated, Dallas, Tex.

[21] Appl. No.: 403,634

[22] Filed: Sep. 6, 1989

[51] Int. Cl.[5] .............................................. H01L 21/60
[52] U.S. Cl. ...................................... 228/4.5; 228/105
[58] Field of Search ........................... 228/4.5, 6.2, 105

[56] References Cited

U.S. PATENT DOCUMENTS

| | | | |
|---|---|---|---|
| 4,234,117 | 11/1980 | Foulke | 228/4.5 |
| 4,501,064 | 2/1985 | DiNozzi et al. | 228/6.2 X |
| 4,619,395 | 10/1986 | Amorosi et al. | 228/4.5 |
| 4,819,094 | 4/1989 | Oberg | 360/137 X |

OTHER PUBLICATIONS

*IBM Technical Disclosure Bulletin*, vol. 31, No. 5, Oct. 1988,–"Optical Closed Loop Surface-Mount Placement Procedure", pp. 20–22.

*Primary Examiner*—Kenneth J. Ramsey
*Attorney, Agent, or Firm*—B. Peter Barndt; Melvin Sharp; James T. Comfort

[57] ABSTRACT

A damping layer of a material and a mounting plate is mounted between an optics tube on a wire bonder and the X-Y table, and between the optics tube and the bond head to dissipate vibrations caused when stepping motors move the X-Y table.

15 Claims, 2 Drawing Sheets

| STANDARD OPTICS TUBE DATA | | | |
|---|---|---|---|
| MOVE DISTANCE (mils) | SETTLE TIME TO 0.2 mil (msec) | SETTLE TIME TO 0.1 mil (msec) | SETTLE TIME TO 0.0 mil (msec) |
| 30 | 48 | 55 | 64 |
| 40 | 40 | 50 | 58 |
| 50 | 16 | 28 | 32 |
| 60 | 30 | 38 | 54 |
| 70 | 40 | 50 | 62 |
| 100 | 25 | 33 | 52 |

| DAMPED OPTICS TUBE DATA | | | |
|---|---|---|---|
| MOVE DISTANCE (mils) | SETTLE TIME TO 0.2 mil (msec) | SETTLE TIME TO 0.1 mil (msec) | SETTLE TIME TO 0.0 mil (msec) |
| 30 | 22 | 26 | 35 |
| 40 | 14 | 22 | 32 |
| 50 | 10 | 18 | 28 |
| 60 | 10 | 20 | 32 |
| 70 | 10 | 20 | 32 |
| 100 | 20 | 25 | 32 |

DAMPED OPTICS TUBE ASSEMBLY

FIELD OF THE INVENTION

This invention relates to wire bonders used in semiconductor assembly and more particularly to a damped optics tube assembly for used in such bonders.

BACKGROUND OF THE INVENTION

In automated semiconductor wire bonders, an optics tube, through which the semiconductor is viewed, is rigidly connected to a bond head and X-Y table. The optics tube is connected to an X-Y table that moves the bond head to exact positions for wire bonding bond pads on a semiconductor chip to the lead frame lead fingers.

The X-Y table is moved by stepper motors that move in stepped increments. Each time the bond head is moved by either the X or Y direction stepper motor, the optics tube and the bond head mounted thereon is vibrated. The time for the vibration to cease is the settling time, and this vibration introduces a delay between each bond since the vibration must cease before a bond can be made. This delay decreases the number of bonds that can be made during the work day thus slowing production.

SUMMARY OF THE INVENTION

The invention is characterized by damping the interface between the X-Y table of a wire bonder and the optics tube on which the bond head is mounted. The rigid connection between the X-Y table and optics tube, and between the optics tube and bond head is replaced by a material that dissipates the energy of vibration generated by each movement of the X-Y table when the stepper motors move the X-Y table.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

A damped optics tube replaces a rigidly mounted optics tube on a wire bonder. Both the X-Y table and the bond head are attached to the optics tube using a compliant material interface which dissipates the vibration in the optics tube and bond head due to vibrations caused by the stepper motors that drive the X-Y table.

Figure 1:
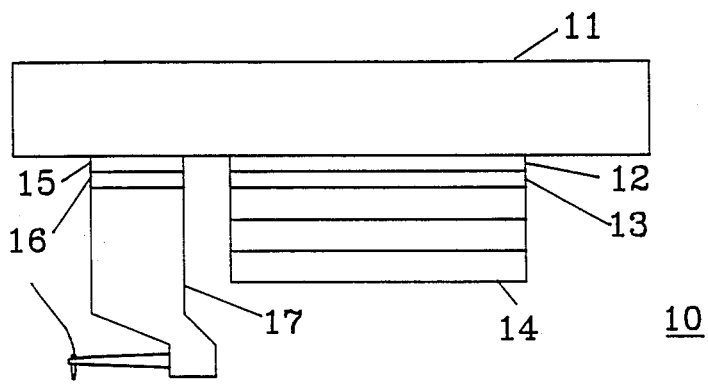
FIG. 1 is a simplified view of a damped optics tube and bond head mounted on an X-Y table.

FIG. 1 shows a simplified drawing 10 of an optics tube attached to an X-Y table and a bond head. Optics tube 11 is attached to X-Y table 14 using a damping interface made of a thermoplastic material 12 and a mounting plate 13. Bond head 17 is attached to optics tube 11 using damping material 15 and mounting plate 16. Detail of mounting is discussed below with reference to FIG. 5.

Thermoplastic material 12 and 15 retains it original shape and position with respect to optics tube 11 and mounting plates 13 and 16 after dissipating the energy of vibration to insure the high degree of position accuracy required for precision bonding.

Figures 2, 3:
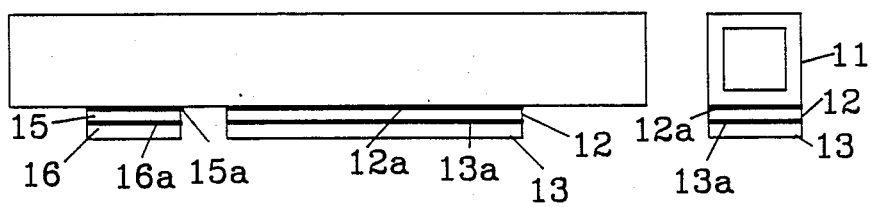
FIG. 2 is a side view of the optics tube with damping material and mounting plates.
FIG. 3 is an end view of the optics tube.

FIG. 2 is a side view of optics tube 11, the thermoplastic material 12 and 15 and mounting plates 13 and 16. Thermoplastic material 12 and 15 are bonded to the optics tube 11 with a thin layers of evenly applied adhesive 12a and 15a. Mounting plates 13 and 16 are secured to thermoplastic material 12 and 15 using thin layers of adhesive 15a and 16a.

FIG. 3 is an end view of the optics tube 11 showing that the thermoplastic material 12 (and 15), and mounting plate 13 (and 16) extend the width of the optics tube. Thermoplastic material 12 and mounting plate 13 need not extend the exact width of the optics tube, but in doing so provides more damping material and a stable mounting surface.

Figure 4:
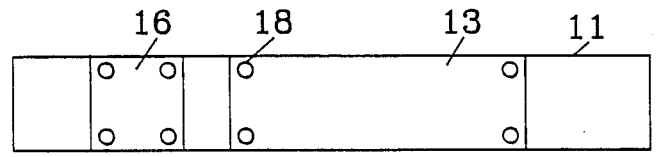
FIG. 4 is a bottom view of the optics tube.

FIG. 4 is a bottom view of the optics tube assembly, showing optics tube 11 and mounting plates 13 and 16. The optics tube 11 and thermoplastic material 12 and 15 have clearance holes 18 therein which extend completely through the optics tube 11, thermoplastic material 12 and 15, and mounting plates 13 and 16 have similar mounting holes.

Figures 5, 6, 7:
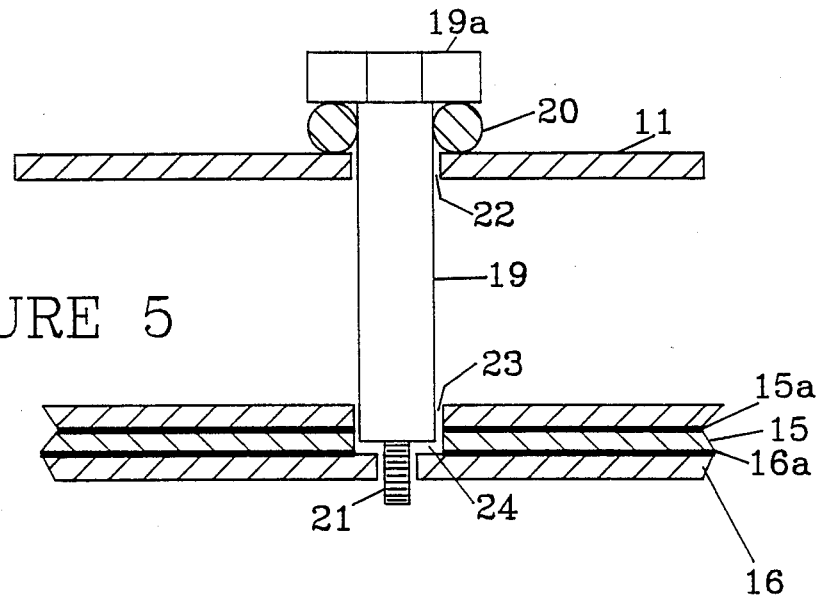
FIG. 5 illustrates the mounting for the damped optics tube.
FIG. 6 is a table showing settling times for a non-damped optics tube.
FIG. 7 is a table showing settling times for a damped optics tube.

FIG. 5 illustrates the mounting of the optics tube 11 to the X-Y table 14 and to bond head 17. Shoulder bolts 19 are used to secure the optics tube to the X-Y table and bond head. Shoulder bolt 19 is passed through clearance holes 22 and 23 in the walls of the optic tube 11, thermoplastic material 12 and 15, and mounting plates 13 and 16 and bottoms out on the mounting plate at 24. The through holes have sufficient clearance so that the bolt shaft does not make contact with the assembly except at the shoulder face.

An O-ring 20 is between the bolt head 19a and optics tube 11. O-ring 20 is used basically as a dust cover and does not contribute fastening pressure. All fastening pressure is made at bolt shoulder face at 24. Threaded end 21 of shoulder bolt 19 is threaded and is used to fasten the optics tube 11 to the X-Y table 14, and to fasten the bond head 17 to optics tube 11.

FIGS. 6 and 7 are experimental data showing settling time with and with out damped mounting for the optics tube.

FIG. 6 is data for a standard mount optics tube. Movements of the X-Y table between 30 and 100 mils were made and the settling times for the bond head to settle to a peak to peak amplitude of 0.2 mil, 0.1 mil and 0.0 mil were measured for each moved distance. Settling times for the bond head to settle to a 0.0 mil amplitude ranged from 52 msec for 100 mils distance to 64 msec for a movement of 30 mils.

FIG. 7 is data for a damped mount optics tube. Movements of the X-Y table between 30 and 100 mils were made and the settling times for the bond head to settle to a peak to peak amplitude of 0.2 mil, 0.1 mil and 0.0 mil were measured for each moved distance. Settling times for the bond head to settle to a 0.0 mil amplitude ranged from 32 msec for 100 mils distance to 35 msec for a movement of 30 mils.

Comparing the data for the standard mounted optics tube and the damp mounted optics tube, it is observed that there is an average improvement of about 22 msec for the test data, indicating that by damp mounting the optics tube on the bond head, the settling time can be improved significantly.

What is claimed:

1. A damped optics tube assembly for a wire bonder including an X-Y table on which the optics tube is mounted and a bond head attached to the optics tube, comprising:
   an optics tube;
   an X-Y table including stepper motors for moving the table;
   a bond head;
   a first damping layer mounted between the optics tube and the X-Y table; and
   a second damping layer mounted between the optics tube and the bond head;
   wherein the damping layers damp out vibrations to the optics tube and bond head caused by the stepper motors moving the X-Y table.

2. The optics tube assembly according to claim 1, wherein the first and second damping layers include a thermoplastic layer and a metal mounting plate.

3. The optics tube assembly according to claim 1, wherein the first and second damping layers are attached to the optics tube by a thin layer of adhesive.

4. The optics tube assembly according to claim 2, wherein the thermoplastic layer and the metal mounting plate are attached together by a thin layer of adhesive.

5. The optics tube assembly according to claim 1, wherein the optics tube is attached to the X-Y table by shoulder bolts and a mounting plate.

6. The optics tube assembly according to claim 1, wherein the optics tube is attached to the bonder head by shoulder bolts and a mounting plate.

7. A damped optics tube assembly for a wire bonder including an X-Y table on which the optics tube is mounted and a bond head attached to the optics tube, comprising:
   an optics tube;
   an X-Y table including stepper motors for moving the table;
   a bond head;
   a first multilayer damping layer mounted between the optics tube and the X-Y table; and
   a second multilayer damping layer mounted between the optics tube and the bond head;
   wherein the damping layers damp out vibrations to the optics tube and bond head caused by the stepper motors moving the X-Y table.

8. The optics tube assembly according to claim 7, wherein the first and second damping layers include a thermoplastic layer and a metal mounting plate adhered together.

9. The optics tube assembly according to claim 7, wherein the first and second damping layers are attached to the optics tube by a thin layer of adhesive.

10. The optics tube assembly according to claim 8, wherein the thermoplastic layer and the metal mounting plate are attached together by a thin layer of adhesive.

11. The optics tube assembly according to claim 7, wherein the optics tube is attached to the X-Y table by shoulder bolts and a mounting plate.

12. The optics tube assembly according to claim 7, wherein the optics tube is attached to the bond head by shoulder bolts and a mounting plate.

13. A damped optics tube assembly for a wire bonder including an X-Y table on which the optics tube is mounted and a bond head attached to the optics tube, comprising:
   an optics tube;
   an X-Y table including stepper motors for moving the table;
   a bond head;
   a first damping layer mounted between the optics tube and the X-Y table;
   a first mounting plated attached to the first damping layer;
   a second damping layer mounted between the optics tube and the bond head; and
   a second mounting plated attached to the second damping layer;
   wherein the damping layers damp out vibrations to the optics tube and bond head caused by the stepper motors moving the X-Y table.

14. The optics tube assembly according to claim 13, including a plurality of shoulder bolts extending through the optics tube and the damping layers attaching said first mounting plated to the X-Y table.

15. The optics tube assembly according to claim 13, including a plurality of shoulder bolts extending through the optics tube and the damping layers attaching said second mounting plated to the bond head.

* * * * *